US009947855B2

(12) United States Patent
Kirihara et al.

(10) Patent No.: US 9,947,855 B2
(45) Date of Patent: Apr. 17, 2018

(54) THERMOELECTRIC CONVERSION ELEMENT AND METHOD OF MANUFACTURING THE SAME, AND HEAT RADIATION FIN

(75) Inventors: Akihiro Kirihara, Tokyo (JP); Masahiko Ishida, Tokyo (JP); Shigeru Koumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 718 days.

(21) Appl. No.: 14/346,803

(22) PCT Filed: Sep. 15, 2012

(86) PCT No.: PCT/JP2012/073755
§ 371 (c)(1),
(2), (4) Date: Mar. 24, 2014

(87) PCT Pub. No.: WO2013/047256
PCT Pub. Date: Apr. 4, 2013

(65) Prior Publication Data
US 2014/0230873 A1  Aug. 21, 2014

(30) Foreign Application Priority Data

Sep. 26, 2011 (JP) ................. 2011-208937

(51) Int. Cl.
*H01L 37/00* (2006.01)
*H01L 37/04* (2006.01)
(Continued)

(52) U.S. Cl.
CPC ............. *H01L 37/00* (2013.01); *H01L 37/02* (2013.01); *H01L 37/04* (2013.01);
(Continued)

(58) Field of Classification Search
CPC ....... H01L 37/00; H01L 37/02; H01L 37/025; H01L 37/04; H01L 43/04; H01L 35/34;
(Continued)

(56) References Cited

U.S. PATENT DOCUMENTS 3,880,674 A * 4/1975 Saunders ................ H01L 35/08
136/237
6,710,238 B1 * 3/2004 Shingu .................... H01L 23/24
136/201
(Continued)

FOREIGN PATENT DOCUMENTS

JP  2007-093106 A  4/2007
JP  2009-130070 A  6/2009
(Continued)

OTHER PUBLICATIONS

K Uchida, "Electric detection of the spin-Seebeck effect in magnetic insulator in the presence of interface barrier" Journal of Physics: Conference Series 303 (2011) 012096.*
(Continued)

*Primary Examiner* — Jeffrey T Barton
*Assistant Examiner* — Michael Y Sun
(74) *Attorney, Agent, or Firm* — Wilmer Cutler Pickering Hale and Dorr LLP

(57) ABSTRACT

A thermoelectric conversion element includes: a magnetic body having a magnetization; and an electromotive body formed of material exhibiting a spin orbit coupling and jointed to the magnetic body. The magnetic body has an upper joint surface jointed to the electromotive body. The upper joint surface has concavities and convexities.

12 Claims, 15 Drawing Sheets

(51) Int. Cl.
  *H01L 37/02* (2006.01)
  *H01L 35/34* (2006.01)
  *H01L 35/28* (2006.01)
  *H01L 35/00* (2006.01)
  *H01L 29/82* (2006.01)
  *H01L 29/66* (2006.01)

(52) U.S. Cl.
  CPC ........ *H01L 29/66984* (2013.01); *H01L 29/82* (2013.01); *H01L 35/00* (2013.01); *H01L 35/28* (2013.01); *H01L 35/34* (2013.01); *H01L 37/025* (2013.01)

(58) Field of Classification Search
  CPC ......... H01L 43/06; H01L 43/14; H01L 23/24; H01L 35/24; H01L 35/18; H01L 35/32; H01L 2924/0002; H01L 29/82; H01L 29/66984; H01L 35/28; H01L 35/00
  See application file for complete search history.

(56) References Cited

U.S. PATENT DOCUMENTS

| | | | |
|---|---|---|---|
| 2005/0023519 A1* | 2/2005 | Osipov | B82Y 10/00 257/17 |
| 2010/0170550 A1* | 7/2010 | Hiroyama | H02N 11/002 136/205 |
| 2010/0276770 A1* | 11/2010 | Uchida | G01K 7/36 257/421 |
| 2012/0018835 A1* | 1/2012 | Sawabe | H01L 35/06 257/470 |

FOREIGN PATENT DOCUMENTS

| | | |
|---|---|---|
| JP | 2010-205883 A | 9/2010 |
| WO | WO-2009-066631 A1 | 5/2009 |
| WO | WO 2012-108276 A1 | 8/2012 |

OTHER PUBLICATIONS

International Search Report corresponding to PCT/JP2012/073755 dated Dec. 11, 2012 (1 page).
K. Uchida et al., "Spin Seebeck Insulator," Nature Materials, vol. 9, pp. 894-897, (2010).
K. Uchida et al., "Observation of Longitudinal Spin-Seebeck Effect in Magnetic Insulators," Applied Physics Letters, vol. 97, 172505 (2010), (3 pages).
K. Uchida et al., "Observation of the Spin Seebeck Effect," Nature, vol. 455, Oct. 9, 2008, pp. 778-781.
H. Adachi et al., "Gigantic Enhancement Spin Seebeck Effect by Phonon Drag," Applied Physics Letter 97, 252506 (2010), (3 pages).
International Preliminary Report on Patentability issued by the International Bureau of WIPO for International Application No. PCT/JP2012/073755 dated Apr. 1, 2014 (4 pgs.).

* cited by examiner

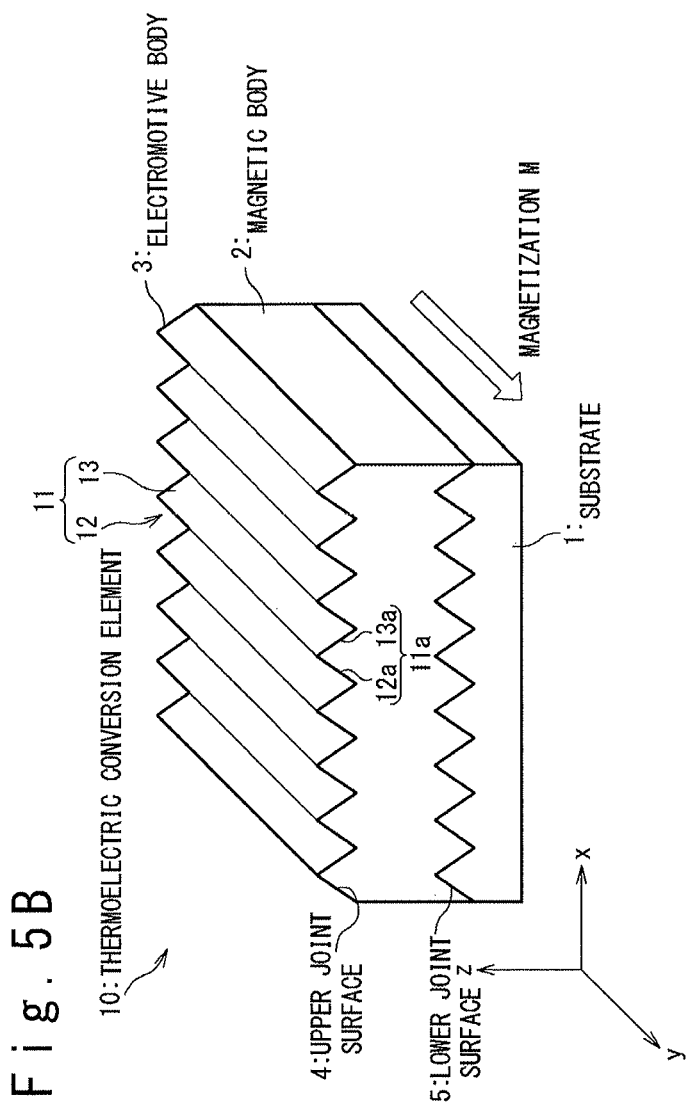

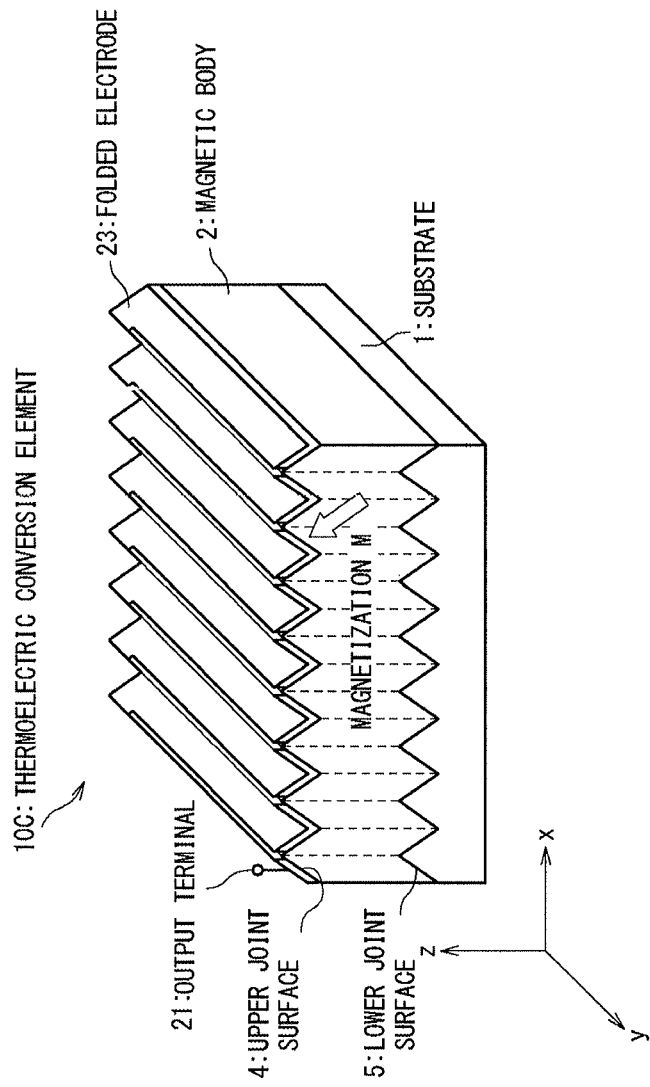

THERMOELECTRIC CONVERSION ELEMENT AND METHOD OF MANUFACTURING THE SAME, AND HEAT RADIATION FIN

CROSS-REFERENCE TO RELATED APPLICATIONS

This application is a national stage application of International Application No. PCT/JP2012/073755 entitled "Thermoelectric Conversion Element and Method of Manufacturing the Same, and Heat Radiation Fin," filed on Sep. 15, 2012, which claims the benefit of the priority of Japanese patent application No. 2011-208937, filed on Sep. 26, 2011, the disclosures of each of which are hereby incorporated by reference in their entirety.

TECHNICAL FIELD

The present invention relates to a thermoelectric conversion element, a method of manufacturing the same, and a heat radiation fin, and more particularly relates to a thermoelectric conversion element that uses the spin-Seebeck effect and the inverse spin-Hall effect.

BACKGROUND ART

In recent years, greater expectations have been placed on thermoelectric conversion elements due to a circumstance in which efforts against environment and energy problems have been actively pursued for realizing a sustainable society. This is because heat is the most general energy source that can be obtained from various media, such as the body temperature, the sunlight, engines and industry exhaust heat. For this reason, it is expected that thermoelectric conversion elements will become increasingly important in future in the purposes of attainment of the highly-efficient energy use in the low-carbon society and the electric power supply to ubiquitous terminals, sensors and the like.

Thermoelectric conversion elements known in the art include those which use the Seebeck effect to generate electric power and those which use the Peltier effect to achieve cooling and heating. A thermoelectric conversion element which uses the Seebeck effect to generate electric power is disclosed in, for example, patent literature 1 (JP 2010-205883 A). The thermoelectric conversion element disclosed in this literature is composed of a plurality of pillar members and a coupling member which couples the pillar members. The pillar members are jointed to a high temperature side electrode, and the coupling member is jointed to a low temperature side electrode. Both of the joint surfaces on which the pillar members are jointed to the high temperature side electrode and on which the coupling member is jointed to the low temperature side electrode are flat surfaces. Also, a thermoelectric conversion element that uses the Peltier effect to achieve cooling and heating is disclosed in, for example, patent literature 2 (JP 2007-93106A). This literature discloses a heat conversion apparatus which uses a corrugated fin. Also in this heat conversion apparatus, the joint surface on which a thermoelectric element and an electrode are jointed is a flat surface.

In recent years, the spin-Seebeck effect, in which a flow of electronic spins is generated when a temperature gradient is applied to magnetic material, has been discovered, and thermoelectric conversion elements have been proposed which convert a flow of angular momentums (or a spin current) generated by the spin-Seebeck effect into an electric current (electromotive force) to be extracted by using the inverse spin-Hall effect. Thermoelectric conversion elements which use the spin-Seebeck effect and the inverse spin-Hall effect to generate electric power have a probability to achieve a conversion efficiency higher than those of thermoelectric conversion elements which use the Seebeck effect, and technical researches and developments have been progressed.

A thermoelectric conversion element which uses the spin-Seebeck effect and the inverse spin-Hall effect is disclosed in, for example, patent literature 3 (JP 2009-130070A) and non-patent literatures 1 and 2. The thermoelectric conversion element disclosed in the patent literature 3 is composed of a ferromagnetic metal film formed by a sputtering method and a metal electrode. In this configuration, when a temperature gradient in the direction parallel to the in-plane direction of the ferromagnetic metal film is applied, a spin current is induced in the direction along the temperature gradient by the spin-Seebeck Effect. The induced spin current can be externally extracted as an electric current by the inverse spin-Hall effect in the metal electrode which is in contact with the ferromagnetic metal film. This allows achieving a temperature difference power generation to extract electric power from heat.

The thermoelectric conversion elements disclosed in non-patent literatures 1 and 2, on the other hand, are composed of a magnetic insulator and a metal electrode. More specifically, non-patent literature 1 reports a thermoelectric conversion based on a temperature gradient parallel to the in-plane direction of the magnetic insulator (that is, the in-plane temperature gradient), similarly to patent literature 3. Also, in non-patent literature 2, the thermoelectric conversion is actually proved by an arrangement with a temperature gradient perpendicular to the plate surface (a temperature gradient in the direction perpendicular to the surface) of the magnetic insulator with a thickness of 1 mm.

It is desirable that a thermoelectric conversion element which uses the spin-Seebeck effect and the inverse spin-Hall effect exhibits a high thermoelectric conversion efficiency. Increased electric energy can be extracted from reduced heat energy as the efficiency of the thermoelectric conversion is increased.

CITATION LIST

Patent Literature

Patent Literature 1: Japanese Patent Application Publication No. 2010-205883 A
Patent Literature 2: Japanese Patent Application Publication No. 2007-93106 A
Patent Literature 3: Japanese Patent Application Publication No. 2009-130070 A

Non-Patent Literature

Non-patent Literature 1: Uchida et al., "Spin Seebeck insulator", Nature Materials, vol. 9, pp. 894-897, (2010).
Non-patent Literature 2: Uchida et al., "Observation of Longitudinal spin-Seebeck effect in magnetic insulators", Applied Physics Letters, 2010, vol. 97, 172505 (2010).
Non-patent Literature 3: H. Adachi et al., "Gigantic enhancement of spin Seebeck effect by phonon drag", Applied Physics Letter 97, 252506 (2010).

SUMMARY OF THE INVENTION

Therefore, an objective of the present invention is to increase the thermoelectric conversion efficiency of a thermoelectric conversion element which uses the spin-Seebeck effect and the inverse spin-Hall effect.

In an aspect of the present invention, a thermoelectric conversion element includes: a magnetic body having a magnetization; and an electromotive body formed of material exhibiting a spin orbit coupling and jointed to the magnetic body. The magnetic body has a joint surface jointed to the electromotive body. The joint surface has concavities and convexities.

In another aspect of the present invention, a heat radiation fin includes: a supporting structure; a magnetic body jointed to the supporting structure and having a magnetization; and an electromotive body exhibiting a spin orbit coupling and jointed to the magnetic body. The supporting structure includes: a base member to be coupled to an object to be cooled; and a plurality of fin members having a plate shape and coupled to the base member. The joint surface on which the magnetic body and the supporting structure are jointed and the joint surface on which the magnetic body and the electromotive body have concavities and convexities.

In another aspect of the present invention, a method of manufacturing a thermoelectric conversion element includes: forming a substrate, a surface of which has concavities and convexities; forming a magnetic body having a magnetization to cover the substrate; forming an electromotive body formed of material exhibiting a spin orbit coupling and jointed to the magnetic body so that the joint surface on which the magnetic body and the electromotive body are jointed has concavities and convexities.

The present invention enables increasing the thermoelectric conversion efficiency of a thermoelectric conversion element which uses the spin-Seebeck effect and the inverse spin-Hall effect.

BRIEF DESCRIPTION OF THE DRAWINGS

FIG. 5B is a view explaining details of the structure of an upper joint surface of the magnetic body of the thermoelectric conversion element in the first exemplary embodiment;

FIG. 7A is a perspective view illustrating the structure of a thermoelectric conversion element in a second exemplary embodiment of the present invention;

DESCRIPTION OF EXEMPLARY EMBODIMENTS

First Exemplary Embodiment

Figure 1:
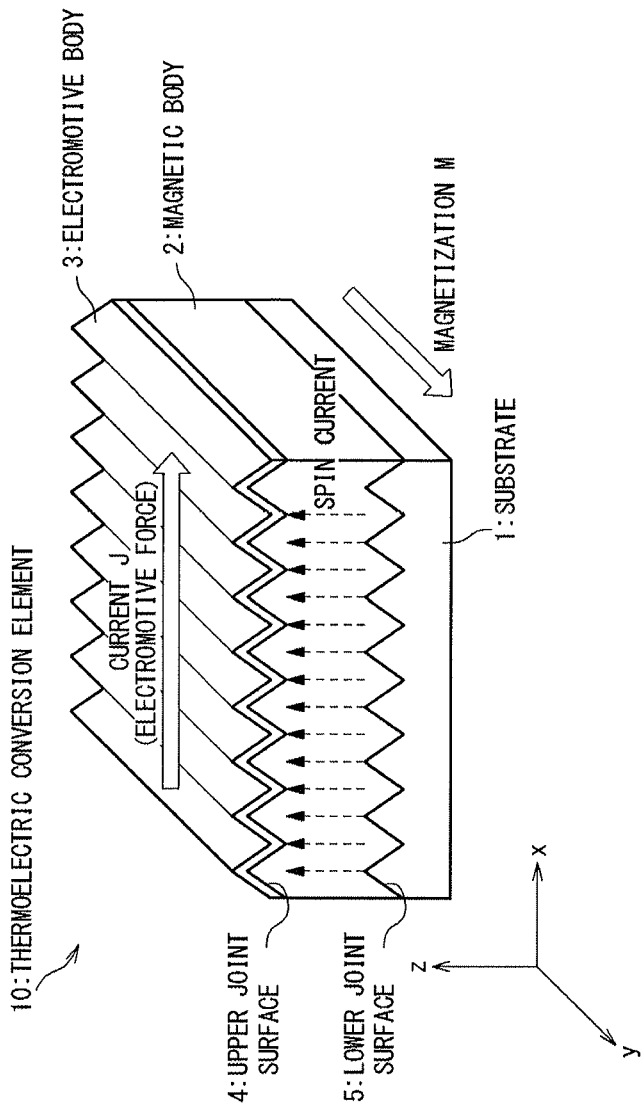
FIG. 1 is a perspective view illustrating the structure of a thermoelectric conversion element in a first exemplary embodiment of the present invention.

FIG. 1 is a perspective view illustrating the structure of a thermoelectric conversion element 10 in a first exemplary embodiment of the present invention. In the following, the structure of the thermoelectric conversion element 10 will be described by using an xyz Cartesian coordinate system.

The thermoelectric conversion element 10 includes a substrate 1, a magnetic body 2 and an electromotive body 3. The substrate 1 is a supporting structure which supports the magnetic body 2 and the electromotive body 3; any material and structure may be used for the substrate 1 as long as the magnetic body 2 and the electromotive body 3 can be supported. Possible materials of the substrate 1 include, for example, Si, glass, alumina, sapphire, gadolinium gallium garnet (GGG), resin (for example, polyimide) and the like.

Material having a (spontaneous) magnetization M is used as the magnetic body 2. In this exemplary embodiment, the magnetization M of the magnetic body 2 is assumed to be directed to the +y direction. Preferably, the magnetic body 2 is formed of magnetic dielectric material, because the thermoelectric conversion efficiency is increased as the thermal conductivity is reduced. Examples of such materials include oxide magnetic materials such as garnet ferrite (yttrium iron ferrite), spinel ferrite and the like.

It should be noted that garnet ferrite with the yttrium sites partially replaced with Bi or the like as impurities may be used as the magnetic body 2. This possibly increases the extraction efficiency of the spin current on the interface between the magnetic body 2 and the electromotive body 3 and thereby improves the thermoelectric conversion efficiency, because the matching between energy levels between the magnetic body 2 and the electromotive body 3 is considered to be improved when the yttrium sites are replaced with impurities.

The electromotive body 3 is made of material that exhibits a spin orbit coupling in order to extract a thermal electromotive force by using the inverse spin-Hall effect. It is preferable that Au, Pt and Pd, which exhibits a relatively large spin orbit coupling, or alloys of two or more of these metals are used as the material of the electromotive body 3, for example. It should be noted that, in order to enhance the inverse spin-Hall effect, the above-listed metals or alloys doped with Fe, Cu, Ir or the like as impurities may be used as the electromotive body 3. For example, a sufficient inverse spin-Hall effect can be obtained only by doping Au, Pt, Pd or Ir at about 0.5 to 10 weight % into a general metal film such as Cu. It is preferable that the thickness of the electromotive body 3 is adjusted to at least one half or more of the spin diffusion length λ (the depth to which the spin current of the magnetic body 2 goes into the electromotive body 3) of the material forming the electromotive body 3. It is most preferable that the thickness of the electromotive body 3 is adjusted to about the spin diffusion length λ (that is, to a range from λ/2 to 4λ). For example, it is most preferable that the thickness of the electromotive body 3 is adjusted to 50 nm or more and 400 nm or less if the electromotive body 3 is made of Au, or adjusted to 8 nm or more and 60 nm or less if the electromotive body 3 is made of Pt.

In this exemplary embodiment, the upper joint surface 4 at which the magnetic body 2 and the electromotive body 3 are jointed has concavities and convexities, and the lower joint surface 5 at which the substrate 1 and the magnetic body 2 are jointed has concavities and convexities. It should be noted that the term "have concavities and convexities" means that the concavities and convexities are intentionally formed by using any means, not including concavities and convexities inevitably generated when the substrate 1 and the magnetic body 2 are formed. As described later, the concavities and the convexities of the upper joint surface 4 and the lower joint surface 5 contribute improvement of the thermoelectric conversion efficiency.

Next, a description is given of the operation of the thermoelectric conversion element 10 in this exemplary embodiment. When a temperature gradient in the z-axis direction is generated in the magnetic body 2 magnetized in the +y direction, a flow of the angular momentums (spin current) is induced in the direction of the temperature gradient the spin-Seebeck effect in the magnetic body 2. In this exemplary embodiment, the generation of the temperature gradient to the magnetic body 2 is achieved by heating the substrate 1. In this case, the lower joint surface 5 of the magnetic body 2 is positioned on the high temperature side, and the upper joint surface 4 is positioned on the low temperature side.

The spin current generated in the magnetic body 2 flows into the electromotive body 3 jointed to the magnetic body 2, and a current J is generated by the inverse spin-Hall effect in this electromotive body 3 in the direction perpendicular to both of the direction of the temperature gradient and the direction of the magnetization M of the magnetic body 2. The current J generates a potential difference across the electromotive body 3 and this potential difference can be extracted as a thermal electromotive force. In other words, the thermoelectric conversion element 10 generates a thermal electromotive force from the temperature difference (temperature gradient) applied to the magnetic body 2.

In this operation, the concavities and the convexities on the upper joint surface 4 at which the magnetic body 2 and the electromotive body 3 are jointed contribute to an improvement of the thermoelectric conversion efficiency. The formation of the concavities and convexities on the upper joint surface 4 enlarges the area of the upper joint surface 4, improving the extraction efficiency of the spin current into the electromotive body 3. In addition, the concavities and convexities on the upper joint surface 4 causes a high heat radiation efficiency, increasing the temperature difference between the upper joint surface 4 and the lower joint surface 5. This implies that the temperature gradient of the magnetic body 2 is increased. These effects of the concavities and convexities on the upper joint surface 4 contribute to the improvement of the thermoelectric conversion efficiency.

The concavities and convexities on the lower joint surface 5 at which the substrate 1 and the magnetic body 2 are jointed also contribute to the improvement of the thermoelectric conversion efficiency. The concavities and convexities on the lower joint surface 5 causes a high heating efficiency of the magnetic body 2, increasing the temperature difference between the upper joint surface 4 and the lower joint surface 5. This implies that the temperature gradient of the magnetic body 2 is increased. As thus discussed, the concavities and convexities on the lower joint surface 5 also contribute to the improvement of the thermoelectric conversion efficiency.

It should be noted that, although both of the upper joint surface 4 and the lower joint surface 5 have concavities and convexities in the thermoelectric conversion element 10 illustrated in FIG. 1, only one of the upper joint surface 4 and the lower joint surface 5 may have concavities and convexities. It would be apparent that even a structure in which only one of the upper joint surface 4 and the lower joint surface 5 has concavities and convexities can attain the improvement of the thermoelectric conversion efficiency.

The magnetic body 2 may be formed as a bulk (or thick film) or as a thin film (which has a film thickness of, for example, 100 μm or less). It should be noted here that, since the thermoelectric conversion efficiency depends on the temperature gradient of the magnetic body 2, one may consider that the temperature gradient is reduced if the magnetic body 2 is formed as a thin film and this is not preferable in view of the thermoelectric conversion efficiency. In contrast, the inventors have actually confirmed that a sufficient thermoelectric conversion efficiency is obtained due to the so-called "phonon drag effect", even if the magnetic body 2 is formed as a thin film. Here, the "phonon drag effect" is a phenomenon in which a spin current generated in a magnetic body non-locally interacts with phonons in the entire thermoelectric conversion element, including a substrate (refer to Applied Physics Letter 97, 252506 (2010) (non-patent literature 3)).

Figure 2:
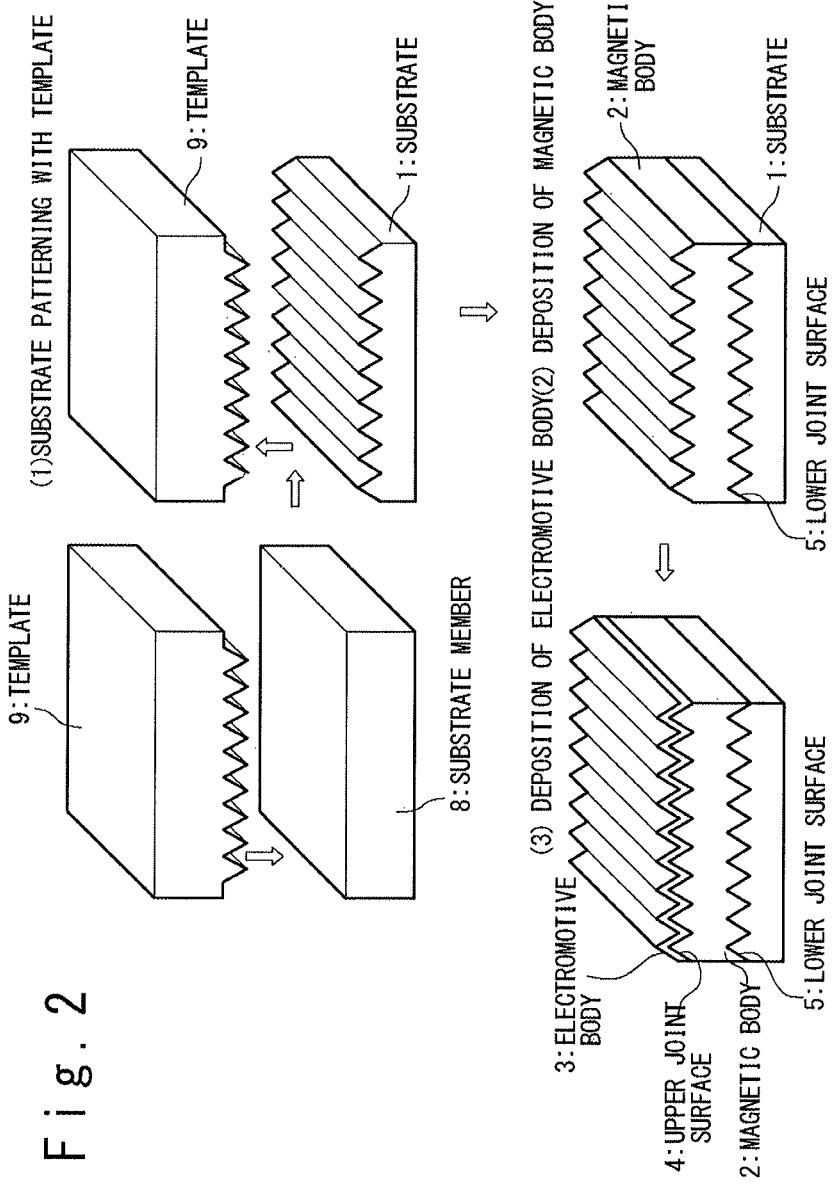
FIG. 2 is a perspective view illustrating an example of a method of manufacturing the thermoelectric conversion element in the first exemplary embodiment of the present invention.

FIG. 2 is a conceptual view illustrating one example of a method of manufacturing the thermoelectric conversion element 10 illustrating in FIG. 1; FIG. 2 illustrates manufacturing steps for the case when the magnetic body 2 is formed as a thin film.

A substrate member 8, which is to be processed into the substrate 1, and a template 9 are prepared. In the example illustrated in FIG. 2, the substrate member 8 is made of plastically processable material, and the concavities and convexities are formed on the template 9. The substrate member 8 is made of, for example, resin such as polyimide.

The manufacturing process of the thermoelectric conversion element 10 begins with patterning the substrate member 8 by using the template 9, thereby forming the substrate 1 that has concavities and convexities (step (1) in FIG. 2). For example, the template 9 is pushed against the substrate member 8 with the substrate member 8 heated up to a temperature at which a plastic property appears, to thereby form the substrate 1 having concavities and convexities.

This is followed by forming the magnetic body 2 to cover the substrate 1 (step (2) in FIG. 2). In this exemplary embodiment, the magnetic body 2 is formed as a thin film. At this stage, since the substrate 1 has been formed so as to have concavities and convexities at the former step, the lower joint surface 5 between the substrate 1 and the magnetic body 2 is also formed to have concavities and convexities. Furthermore, concavities and convexities are also formed on the surface of the magnetic body 2.

A vapor phase deposition method or a liquid phase deposition method may be used as the method of forming the magnetic body 2. For example, the magnetic body 2 may be formed by using a sputtering method, an organic metal dissolving method (MOD method), a sol-gel method or an aerosol deposition method (AD method). Among these deposition methods, the AD method is most desirable for forming the magnetic body 2. This is because more materials and structures of the substrate 1 are selectable for successfully achieving the film deposition, as compared with other film deposition methods, since the formation and densification of the poly-crystal film is achieved with the collision energy of particles in the AD method. In addition, it is possible to form a thin film with an increased thickness of 10 µm or more at a high-speed by using the AD method, while the allowed maximum thickness of the film formed by a sputtering method, an MOD method and other film deposition methods is usually about 1 µm.

Next, the electromotive body 3 is formed to cover the upper surface of the magnetic body 2 (step (3) in FIG. 2). The electromotive body 3 may be formed through, for example, a sputtering method, a vacuum evaporation method, a plating method or a screen printing method. Since the surface of the magnetic body 2 is formed to have concavities and convexities in the former steps, the upper joint surface 4 between the magnetic body 2 and the electromotive body 3 is formed to have concavities and convexities.

With the above-described procedure, the thermoelectric conversion element 10 illustrated in FIG. 1 is manufactured. It should be noted that the method of manufacturing the thermoelectric conversion element 10 is not limited to the above-described method. For example, when a silicon substrate is used as the substrate 1, the concavities and convexities may be formed by an anisotropy etching.

Figure 3:
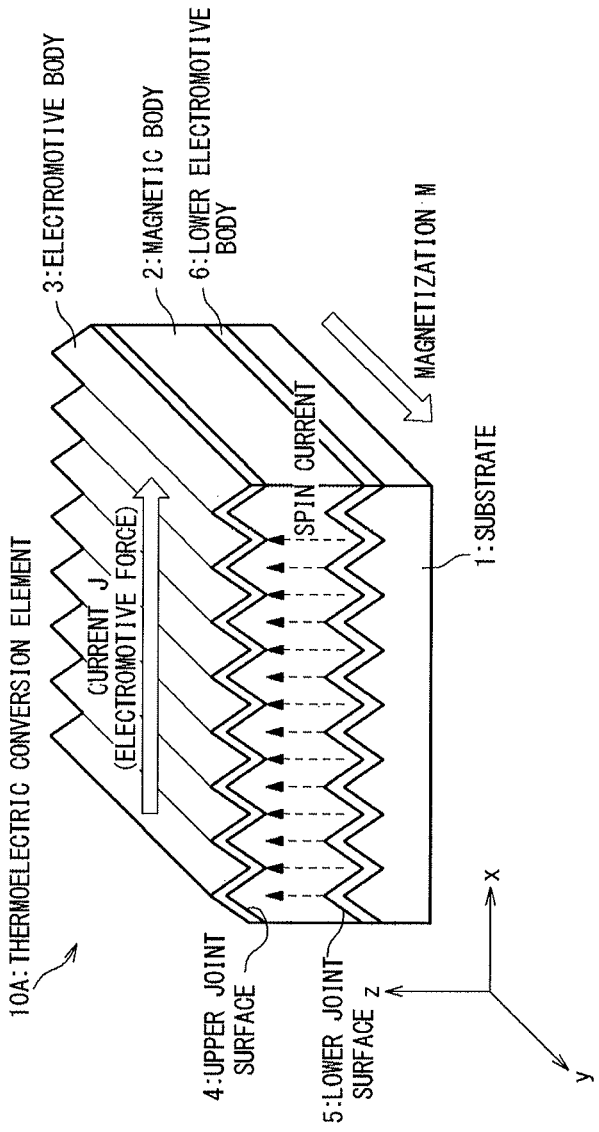
FIG. 3 is a perspective view illustrating an exemplary modification of the thermoelectric conversion element in the first exemplary embodiment.

FIG. 3 is the perspective view illustrating the configuration of a thermoelectric conversion element 10A in an exemplary modification of this exemplary embodiment. The thermoelectric conversion element 10A is structured to have an electromotive body 6 additionally inserted between the substrate 1 and the magnetic body 2. Hereinafter, the electromotive body 3, which is contact with the magnetic body 2 on the upper joint surface 4, is referred to as the upper electromotive body 3, and the electromotive body 6, which is contact with the magnetic body 2 on the lower joint surface 5, is referred to as the lower electromotive body 6 to distinguish the electromotive bodies 3 and 6. The lower electromotive body 6 is formed of material which exhibits a spin orbit coupling to extract a thermal electromotive force by using the inverse spin-Hall effect, and the same material as the upper electromotive body 3 may be used as the lower electromotive body 6. It is preferable that Au, Pt and Pd, which exhibits a relatively large spin orbit coupling, or alloys of two or more of these metals are used as the lower electromotive body 6, for example. It should be noted that, the above-described metals or alloys doped with impurities, such as Fe, Cu and Ir may be used as the lower electromotive body 6 in order to increase the inverse spin-Hall effect. It is preferable that the thickness of the lower electromotive body 6 is adjusted to at least one half or more of the spin diffusion length $\lambda$ (the depth to which the spin current of the magnetic body 2 goes into the electromotive body 6) of the material forming the lower electromotive body 6. It is most preferable that the thickness of the lower electromotive body 6 is adjusted to about the spin diffusion length $\lambda$ (that is, to a range from $\lambda/2$ to $4\lambda$). For example, it is most preferable that the thickness of the lower electromotive body 6 is adjusted to 50 nm or more and 400 nm or less if the lower electromotive body 6 is made of Au, or adjusted to 8 nm or more and 60 nm or less if the lower electromotive body 6 is made of Pt.

Also in the thermoelectric conversion element 10A in FIG. 3, the thermoelectric conversion efficiency is improved by providing concavities and convexities for the upper joint surface 4 between the magnetic body 2 and the upper electromotive body 3 and also providing concavities and convexities for the lower joint surface 5 between the magnetic body 2 and the lower electromotive body 6.

Additionally, since an electric current (electromotive force) is generated not only in the upper electromotive body 3 but also in the lower electromotive body 6 when a temperature gradient is generated in the magnetic body 2, it is possible to further improve the thermoelectric conversion efficiency by extracting an electric current or electromotive force from the lower electromotive body 6. For example, a greater electromotive force can be obtained by electrically connecting the upper electromotive body 3 and the lower electromotive body 6 in series. Also, a greater current can be obtained by electrically connecting the upper electromotive body 3 and the lower electromotive body 6 in parallel.

It should be noted that it would be easily understood by a person skilled in the art that the thermoelectric conversion element 10A in FIG. 3 can be manufactured by adding a step of forming the lower electromotive body 6 on the substrate 1 and then forming the magnetic body 2 on the lower electromotive body 6, to the manufacturing method illustrated in FIG. 2.

Figure 4:
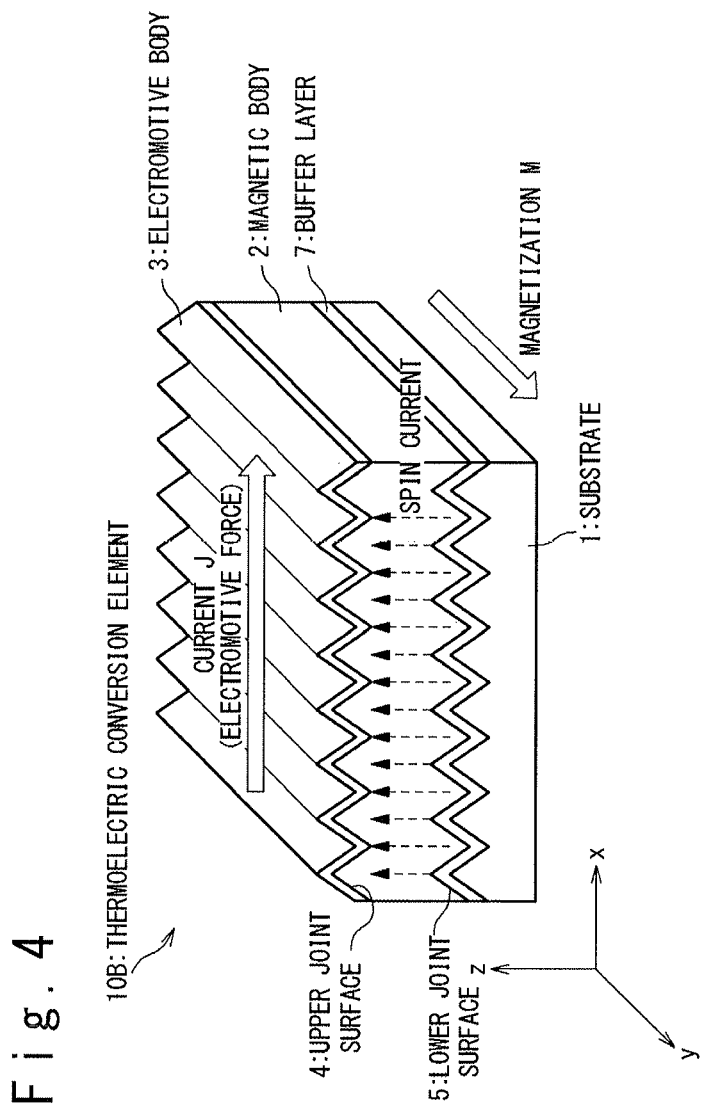
FIG. 4 is a perspective view illustrating another exemplary modification of the thermoelectric conversion element in the first exemplary embodiment.

FIG. 4 is a perspective view illustrating the structure of a thermoelectric conversion element 10B of another exemplary modification of this exemplary embodiment. The thermoelectric conversion element 10B is structured to have a buffer layer 7 additionally inserted between the substrate 1 and the magnetic body 2. The formation of the buffer layer 7 aims at improvement in the property of the magnetic body 2 in the case when the magnetic body 2 is formed as a thin film on the buffer layer 7. In the case when oxide magnetic material such as garnet ferrite (yttrium iron ferrite) and spinel ferrite is used as the magnetic body 2, it is preferable that the magnetic body 2 is formed on a structure formed of oxide material. Conversely, in the case when a substrate made of non-oxide material (for example, a substrate of resin such as polyimide or a silicon substrate) is used as the substrate 1, this causes deterioration in the property of the magnetic body 2 if a structure is employed in which the substrate 1 and the magnetic body 2 are in direct contact with each other as illustrated in FIG. 1. When non-oxide material is used as the substrate 1 and oxide magnetic material is used as the magnetic body 2, the use of the buffer layer 7 made of oxide material improves the property of the magnetic body 2, improving the thermoelectric conversion efficiency. In one exemplary embodiment, the buffer layer 7 may be formed of a silicon oxide film. It should be noted that it would be easily understood by a person skilled in the art that the thermoelectric conversion element 10B illustrated in FIG. 4 can be manufactured by adding a step of forming the buffer layer 7 on the substrate 1 and then forming the magnetic body 2 on the buffer layer 7, to the manufacturing method shown in FIG. 2.

In the above-described exemplary embodiments, the concave and convex shapes of the upper joint surface 4 and the lower joint surface 5 may be variously modified, not limited to a specific shape. It should be noted, however, that an appropriately designed shape of the upper joint surface 4, at which the magnetic body 2 and the upper electromotive body 3 are in contact with each other, enables improving the extraction efficiency of the spin current to the upper electromotive body 3 to thereby enhance the thermoelectric conversion efficiency, as discussed in the following.

In the structures in FIGS. 1, 3 and 4, for example, the direction of the magnetization M is directed in the +y direction while the upper joint surface 4 includes a grating in which a plurality of unit faces are arrayed in the x-axis direction, which is a direction perpendicular to the magnetization M. Such structures are preferable for improving the extraction efficiency of the spin current to the upper electromotive body 3 and enhancing the thermoelectric conversion efficiency. Here, the unit faces are each a non-flat face obtained by moving a generating line defined in a particular face perpendicular to the magnetization M by a particular distance in a direction in parallel with the y-axis direction (the direction parallel to the magnetization M); a unit face is a unit structure which configures the grating. Since the unit faces are each a non-flat surface, the generating line defining the unit faces is also a non-straight line.

Figure 5A:
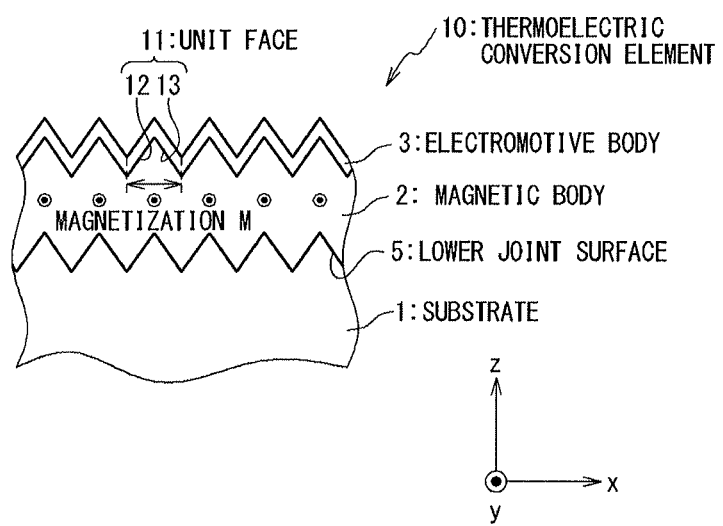
FIG. 5A is a view explaining a preferred magnetization direction of a magnetic body of the thermoelectric conversion element in the first exemplary embodiment.

For example, FIG. 5A and FIG. 5B are views illustrating unit faces 11 and generating lines 11a with respect to the upper joint surface 4 of the thermoelectric conversion element 10 illustrated in FIG. 1. Here, FIG. 5A is a cross-sectional view illustrating the cross-section structure of the thermoelectric conversion element 10 illustrated in FIG. 1 within the xz face, and FIG. 5B is a view illustrating the structure in which the upper electromotive body 3 is removed from the thermoelectric conversion element 10 (to clearly illustrate the structure of the magnetic body 2). The upper joint surface 4 of the thermoelectric conversion element 10 illustrated in FIG. 1 is configured as a grating in which a plurality of unit faces 11 each consisting of rectangular flat faces 12 and 13 are arrayed in the x-axis direction; the upper joint surface 4 is a non-flat face obtained by moving the generating lines 11a in a direction in parallel with the y-axis direction. Here, the generating lines 11a are each a non-straight line composed of lines 12a and 13a which are positioned within a face parallel to the xz face. The lines 12a and 13a are connected to each other at the ends and not positioned in the same straight line. The rectangular flat faces 12 and 13 are flat surfaces obtained by moving the lines 12a and 13a in a direction in parallel with the y-axis direction. It should be noted that the upper joint surface 4 of the thermoelectric conversion elements 10A and 10B illustrated in FIG. 3 and FIG. 4 has the same structure.

Since the spin current flows locally in the direction perpendicular to the magnetization M (which is directed in the +y direction), the spin current efficiently flows into each unit face 11, which is the non-flat surface parallel to the magnetization M. In particular, in the case when the unit faces 11 are each consists of the rectangular flat faces 12 and 13, the spin current efficiently flows into the upper electromotive body 3 from the magnetic body 2 because both of the rectangular flat faces 12 and 13 are in parallel with the magnetization M. Accordingly, the structure in which the upper joint surface 4 includes the grating in which the plurality of unit faces 11 are arrayed in the x-axis direction causes an increase in the spin current which flows into the upper electromotive body 3 from the magnetic body 2, improving the thermoelectric conversion efficiency.

Figure 6:
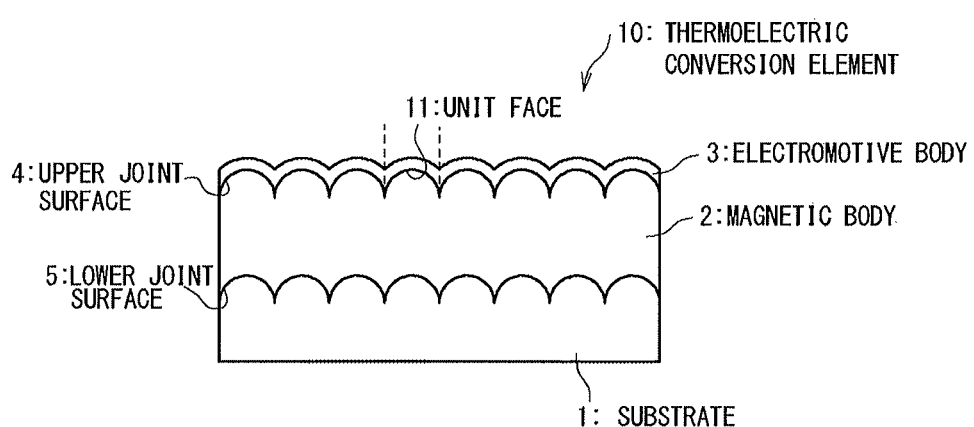
FIG. 6 is a view explaining another structure of the upper joint surface of the magnetic body of the thermoelectric conversion element in the first exemplary embodiment.

It should be noted that the shape of the unit faces 11 which configure the upper joint surface 4 may be variously modified. For example, the unit faces 11 may be each configured as a (smooth) curve which is obtained by moving a smoothly-curved generating line in a direction in parallel with the y-axis direction. More specifically, as illustrated in FIG. 6, the unit faces 11 may be each configured as a half-cylindrical face. In this case, semicircles in a flat face perpendicular to the magnetization M are defined as the generating lines.

The lower joint surface 5 is not directly related to the extraction efficiency at which the spin current is extracted from the magnetic body 2 to the electromotive body 3. However, particularly when the magnetic body 2 is formed as a thin film, the shape of the upper joint surface 4 depends on the shape of the lower joint surface 5. Thus, in order to form the upper joint surface 4 in the shape which includes the grating in which the plurality of unit faces are arrayed in the x-axis direction, which is the direction perpendicular to the magnetization M, it is preferable that the lower joint surface 5 also have the same shape.

It should be noted that the substrate 1 is not necessary in this exemplary embodiment, especially when the magnetic body 2 is formed as a bulk (or a thick film). In this case, a temperature gradient is applied to the magnetic body 2 by directly heating the bottom surface of the magnetic body 2, for example.

Second Exemplary Embodiment

Figure 7B:
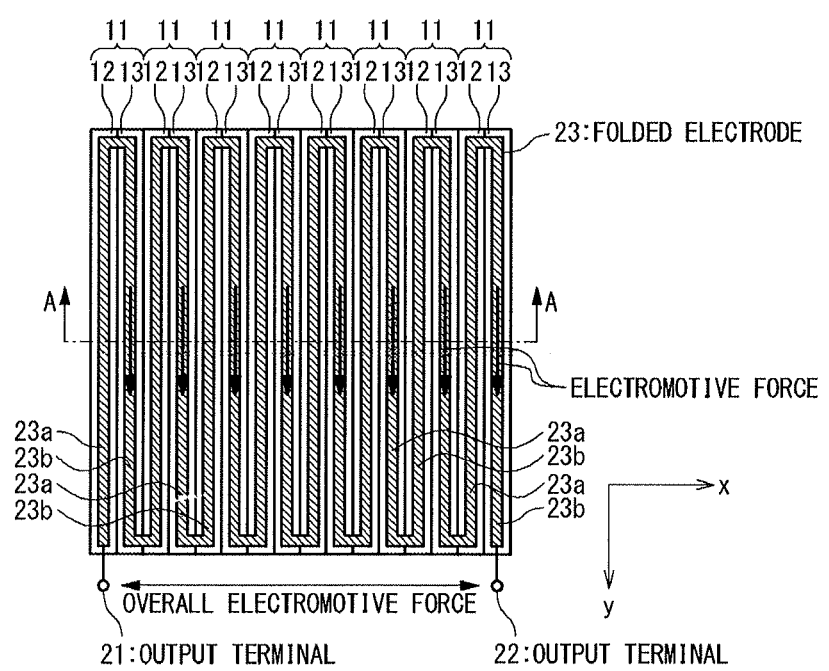
FIG. 7B is a plan view illustrating the structure of the thermoelectric conversion element in the second exemplary embodiment.
Figure 7C:
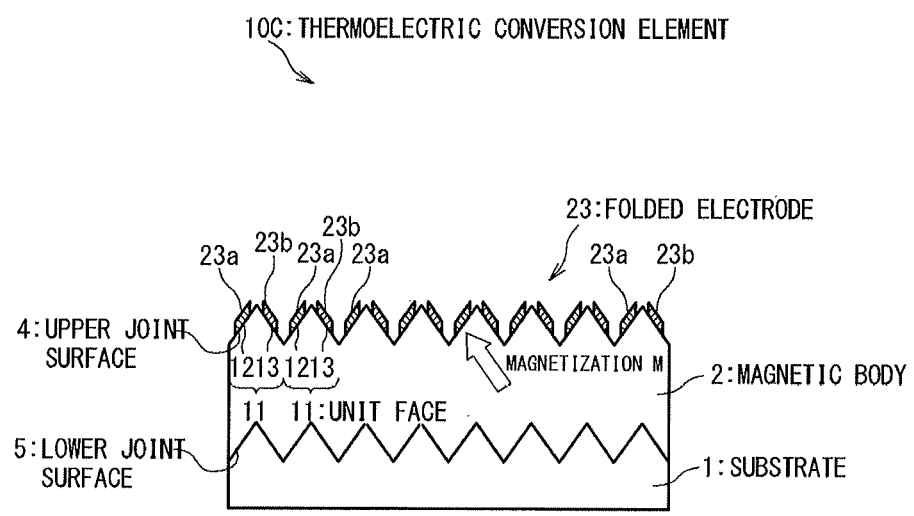
FIG. 7C is a cross-sectional view illustrating the structure of the thermoelectric conversion element on the A-A cross-section in FIG. 7B in the second exemplary embodiment.

FIGS. 7A to 7C illustrates the structure of a thermoelectric conversion element 10C in a second exemplary embodiment of the present invention; more specifically, FIG. 7A is a perspective view of the thermoelectric conversion element 10C, FIG. 7B is a top view of the thermoelectric conversion element 10C, and FIG. 7C is a cross-sectional view of the thermoelectric conversion element 10C on the A-A cross-section in FIG. 7B.

In the second exemplary embodiment, the upper joint surface 4 of the magnetic body 2 is configured as a grating in which a plurality of unit faces 11 each composed of rectangular flat faces 12 and 13 are arrayed in the x-axis direction similarly to the first exemplary embodiment; on the other hand, the electromotive body formed on the upper joint surface 4 is formed as a folded electrode 23. An output terminal 21 is coupled to the folded electrode 23 in the vicinity of one end of the folded electrode 23, and an output terminal 22 is formed at the vicinity of the other end. The output terminals 21 and 22 are used to extract the generated current or voltage.

The folded electrode 23 is made of material which exhibits a spin orbit coupling to extract a thermal electromotive force by using the inverse spin-Hall effect, as is the case with the electromotive body 3 of the first exemplary embodiment. More specifically, it is preferable that Au, Pt and Pd, which exhibits a relatively large spin orbit coupling, or alloys of two or more of these metals are used as the folded electrode 23, for example. It should be noted that, in order to enhance the inverse spin-Hall effect, the above-listed metals or alloys doped with Fe, Cu, Ir or the like as impurities may be used as the folded electrode 23. It is preferable that the thickness of the folded electrode 23 is adjusted to the spin diffusion length λ or more of the material forming the folded electrode 23. More specifically, for example, it is preferable that the thickness of the folded electrode 23 is adjusted 50 nm or more if the folded electrode 23 is made of Au, or adjusted to 10 nm or more if the folded electrode 23 is made of Pt.

In addition, as illustrated in FIGS. 7B and 7C, the folded electrode 23 includes electrode segments 23a formed on the rectangular flat faces 12 and electrode segments 23b formed on the rectangular flat faces 13. A pair of electrode segments 23a and 23b associated with each unit faces 11 are coupled to each other at the ends in the −y direction, and the electrode segment 23b associated with each unit face 11 and the electrode segment 23a associated with the adjacent unit face 11 are coupled to each other at the ends in the +y direction. In this manner, the folded electrode 23 is structured such that the electrode segments 23a formed on the rectangular flat faces 12 and the electrode segments 23b formed on the rectangular flat faces 13 are alternately connected in series.

The thermoelectric conversion element 10C in the second exemplary embodiment operates as follows. When the substrate 1 is heated and a temperature gradient in the z-axis direction is thereby generated in the magnetic body 2, which is magnetized in the +y direction, for example, the spin-Seebeck effect in the magnetic body 2 induces a flow of angular momentums (a spin current) in the direction of the temperature gradient.

The spin current generated in the magnetic body 2 flows into the folded electrode 23 jointed to the magnetic body 2, and a current J is generated in a direction perpendicular to both of the direction of the temperature gradient and the direction of the magnetization M by the inverse spin-Hall effect in the folded electrode 23. This current J generates a potential difference across the folded electrode 23.

In this exemplary embodiment, in order to effectively generate an electromotive force across the folded electrode 23, the magnetization M of the magnetic body 2 is directed in such a direction that the amplitudes of the spin currents flowing into the electrode segments 23a formed on the rectangular flat faces 12 and the electrode segments 23b formed on the rectangular flat faces 13 from the magnetic body 2 are different. In the more strict sense, the direction of the magnetization M is directed in such a direction that the magnitude of the vector obtained by projecting a unit vector directed in the direction of the magnetization M onto each rectangular flat face 12 is smaller than the magnitude of the vector obtained by projecting the unit vector directed in the direction of the magnetization M onto each rectangular flat face 13. By directing the magnetization M in such a direction, different electromotive forces are generated between the electrode segments 23a formed on the rectangular flat faces 12 and the electrode segments 23b formed on the rectangular flat faces 13 and an electromotive force is obtained across the folded electrode 23 as a whole. In this exemplary embodiment, the magnetization M is directed in a direction in the xz face and in parallel with the rectangular flat faces 13. As described in detail below, it is possible to generate a large electromotive force by directing the magnetization M in this direction.

Figure 8A:
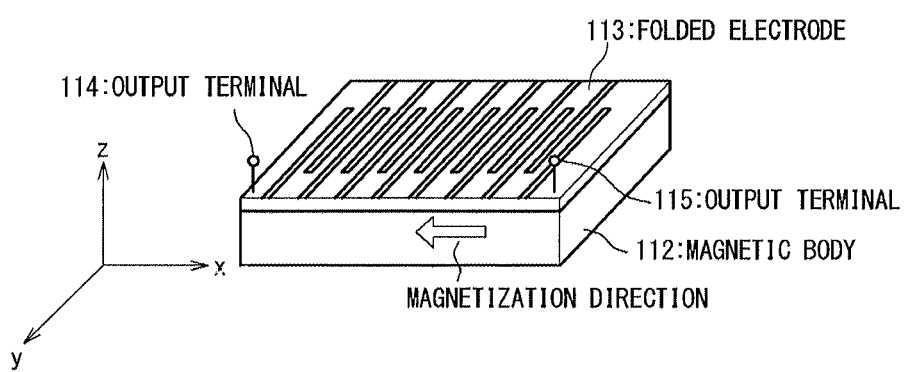
FIG. 8A is a perspective view illustrating an example of the structure of the thermoelectric conversion element in which the top surface of the magnetic body is flat and a folding electrode is formed on the top surface.
Figure 8B:
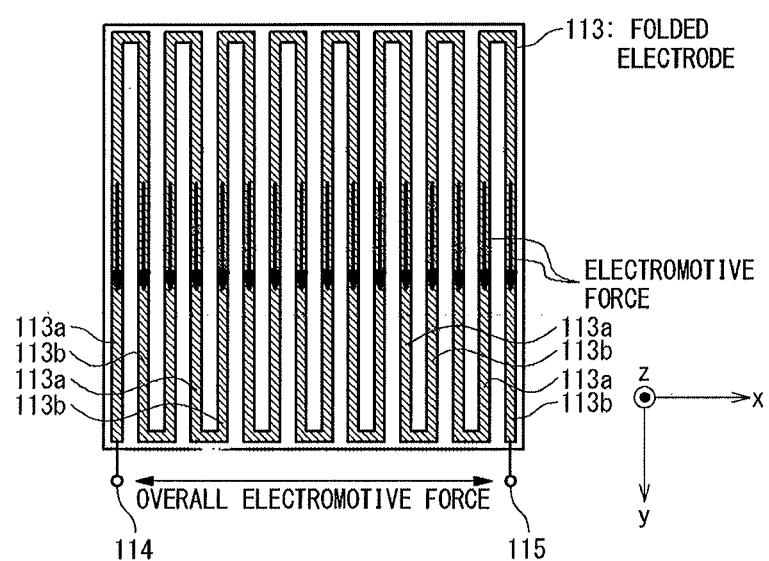
FIG. 8B is a plan view illustrating the structure of the thermoelectric conversion element illustrated in FIG. 8A.

Let us suppose the case, for example, when the magnetization of a magnetic body 112 is directed in the −x direction and the top surface of the magnetic body 112 is flat, while a folded electrode 113 having an in-plane shape similar to the folded electrode 23 is formed on the top surface, as illustrated in FIGS. 8A and 8B. In this case, as shown in FIG. 8B, the electromotive forces are cancelled in the folding electrode 113 between the portions where the current is sent in the +y direction and the portions where the current is sent in the −y direction, and the overall electromotive force across the folding electrode 113 obtained from output terminals 114 and 115 is substantially zero.

When the upper joint surface 4 of the magnetic body 2 is configured as the grating in which the plurality of unit faces 11 each composed of the rectangular flat faces 12 and 13 are arrayed in the x-axis direction as is the case with the thermoelectric conversion element 10C in this exemplary embodiment, on the other hand, the magnetization M is directed in a direction in the xz face and in parallel with the rectangular flat faces 13, and thus no electromotive forces are generated in the electrode segments 23a formed on the rectangular flat faces 12 (or, only a small electromotive force is generated); substantially only the electromotive forces generated in the electrode segments 23b formed on the rectangular flat faces 13 contribute to the overall electromotive force generated across the folded electrode 23. Since the respective electrode segments 23b are electrically connected in series via the electrode segments 23a (which generate no electromotive forces), a large electromotive force can be obtained across the folded electrode 23 as a whole.

It should be noted that the direction of the magnetization M is not required to perfectly coincide with the direction in the xz face and in parallel with the rectangular flat faces 13. Even when the direction of the magnetization M is slightly misaligned from the direction parallel to the rectangular flat faces 13, a sufficient electromotive force can be obtained.

Third Exemplary Embodiment

Figure 9A:
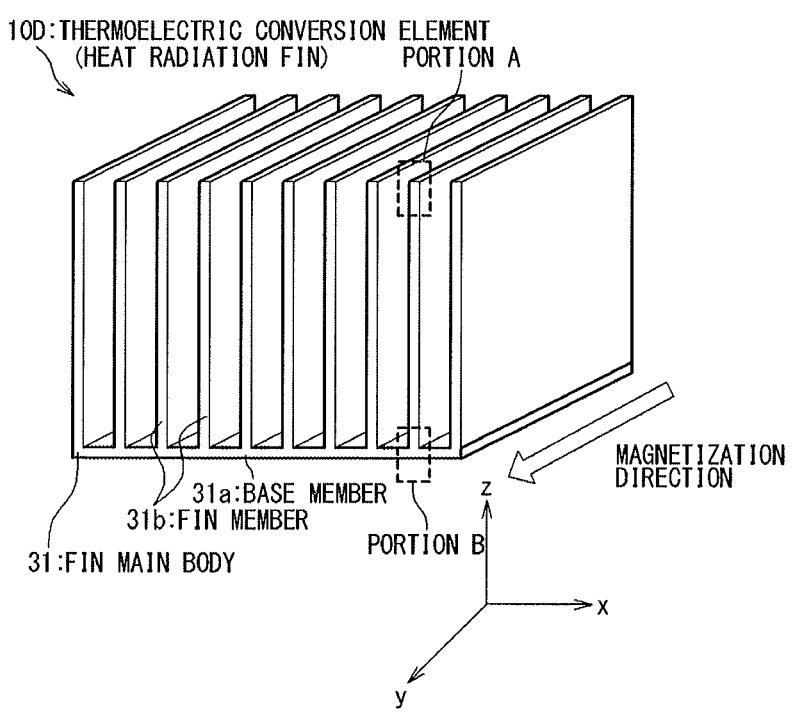
FIG. 9A is a perspective view illustrating the structure of a thermoelectric conversion element in a third exemplary embodiment of the present invention.
Figure 9B:
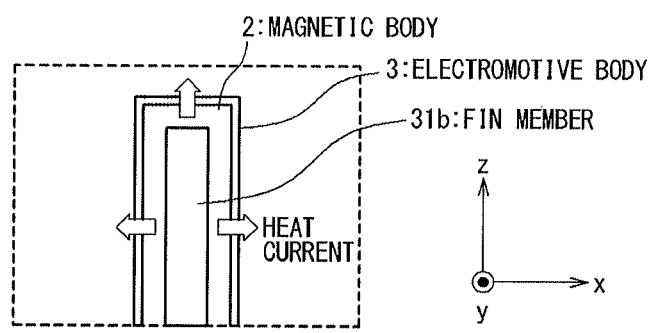
FIG. 9B is a cross-sectional view illustrating the structure of portion A of the thermoelectric conversion element in the third exemplary embodiment.
Figure 9C:
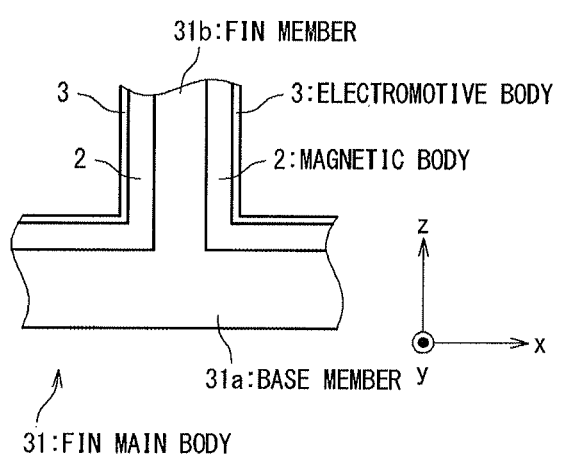
FIG. 9C is a cross-sectional view illustrating the structure of portion B of the thermoelectric conversion element in the third exemplary embodiment.

FIGS. 9A to 9C illustrates the structure of a thermoelectric conversion element 10D in a third exemplary embodiment of the present invention, whereas FIG. 9A is a perspective view of the thermoelectric conversion element 10, FIG. 9B is a cross-sectional view illustrating the structure of portion A in FIG. 9A and FIG. 9C is a cross-sectional view illustrating the structure of portion B in FIG. 9A. In the third exemplary embodiment, the thermoelectric conversion element 10D is implemented as a heat radiation fin. In details, in the thermoelectric conversion element 10D, a stack structure including a magnetic body 2 and an electromotive body 3 is formed on the surface of a fin main body 31 (and not on the substrate 1). The magnetization of the magnetic body 2 is directed in the +y direction. In the following, a detailed description is given of the structure of the thermoelectric conversion element 10D in the third exemplary embodiment.

The fin main body 31 includes a base member 31a and a plurality of fin members 31b. The base member 31a is a member thermally coupled to an object to be cooled (not shown). The plurality of fin members 31b are jointed to the base member 31a. The fin members 31b each have a plate shape and the fin members 31b are arrayed in the x-axis direction with the fin members 31b each directed in parallel with the yz face. The stack structure composed of the magnetic body 2 and the upper electromotive body 3 is formed at least on the surfaces having a normal line parallel to the z-axis direction and the surfaces having a normal line parallel to the x-axis direction, among the surfaces of the fin main body 31.

The thermoelectric conversion element 10D in this exemplary embodiment operates as follows: When heat is transferred to the fin main body 31 from the object to be cooled which is coupled to the fin main body 31, a heat current sent from the fin main body 31 to the magnetic body 2 and the upper electromotive body 3 is generated, and a temperature gradient is generated in the magnetic body 2. With the spin-Seebeck effect in the magnetic body 2, a flow of angular momentums (or a spin current) is induced in the direction of the temperature gradient.

The spin current generated in the magnetic body 2 goes into the upper electromotive body 3 jointed to the magnetic body 2 and an electric current is generated by the inverse spin-Hall effect in the upper electromotive body 3 in the direction perpendicular to both of the direction of the temperature gradient and the direction of the magnetization M of the magnetic body 2. This current causes an electromotive force to be generated across the upper electromotive body 3. The current or electromotive force generated across the upper electromotive body 3 is externally extracted and used.

In the thermoelectric conversion element 10D thus structured, the thermoelectric conversion efficiency can be improved, since the joint surface at which the magnetic body 2 and the electromotive body 3 are jointed has concavities and convexities and the joint surface at which the magnetic body 2 and the fin main body 31 are jointed also has concavities and convexities. In addition, the structure in which the thermoelectric conversion element 10D is implemented as a heat radiation fin allows re-using heat of a member to be cooled, contributing to an efficient use of the energy.

Although the present invention has been described with reference to exemplary embodiments in the above, the present invention is not limited to the above-described exemplary embodiments. Various modifications understood by a person skilled in the art may be accompanied with respect to the structures and details of the present invention within the scope of the present invention. It should be also noted that the above-described exemplary embodiments may be combined as long as no technical conflict occurs therein.

The invention claimed is:

1. A thermoelectric conversion element, comprising:
a magnetic body having a magnetization; and
a first electromotive body formed of material exhibiting a spin orbit coupling and jointed to said magnetic body,
wherein said magnetic body has a first joint surface jointed to said first electromotive body, and
wherein said first joint surface has concavities and convexities
wherein said magnetization of said magnetic body is directed in a first direction,
wherein said first joint surface has a shape in which a plurality of unit faces are arrayed in a second direction perpendicular to said first direction, and
wherein each of said unit faces is a non-flat face obtained by moving a first generating which is not straight line located in a flat face perpendicular to said first direction, in said first direction,
wherein the magnetic body comprises an oxide magnetic material.

2. The thermoelectric conversion element according to claim 1, further comprising a supporting structure,
wherein said magnetic body further has a second joint surface opposed to said first joint surface,
wherein said second joint surface is directly or indirectly coupled to said supporting structure, and
wherein said second joint surface has concavities and convexities.

3. The thermoelectric conversion element according to claim 2, further comprising a buffer layer inserted between said supporting structure and said magnetic body,
wherein said second joint surface is jointed to said buffer layer.

4. The thermoelectric conversion element according to claim 3, wherein said buffer layer is formed of oxide material.

5. The thermoelectric conversion element according to claim 2, further comprising a second electromotive body inserted between said supporting structure and said magnetic body and formed of material exhibiting a spin orbit coupling,
wherein said second joint surface is jointed to said second electromotive body.

6. The thermoelectric conversion element according to claim 1,
wherein the first joint surface is a surface formed by moving a second generating line in the first direction,
wherein the second generating line is arrayed in a second direction crossing the first direction.

7. The thermoelectric conversion element according to claim 1, wherein said unit faces each include:
a first flat face; and
a second flat face having an end coupled to an end of said first flat face and not located in the same flat face as said first flat face,
wherein both of said first and second flat faces are in parallel with said magnetization of said magnetic body.

8. A thermoelectric conversion element, comprising:
a magnetic body having a magnetization; and
a first electromotive body formed of material exhibiting a spin orbit coupling and jointed to said magnetic body,
wherein said magnetic body has a first joint surface jointed to said first electromotive body, and
wherein said first joint surface has concavities and convexities,
wherein said first joint surface has a shape in which a plurality of unit faces are arrayed in a second direction perpendicular to said first direction,
wherein each of said unit faces includes:
a first flat face;
a second flat face having an end coupled to an end of said first flat face and not located in the same flat face as said first flat face,
wherein said first electromotive body has a structure in which first electrode segments each formed on said first flat face and second electrode segments each formed on said second flat face are alternately connected in series,
wherein a direction of said magnetization of said magnetic body is directed in such a direction that a magnitude of a vector obtained by projecting a unit vector directed in the direction of said magnetization onto said first flat face is smaller than a magnitude of a vector obtained by projecting said unit vector onto said second flat face,
wherein the magnetic body comprises an oxide magnetic material.

9. The thermoelectric conversion element according to claim 8, wherein the direction of said magnetization of said magnetic body is in parallel with said second flat face.

10. Thermoelectric conversion element according to claim 1, wherein said first joint surface has a grating structure.

11. Thermoelectric conversion element according to claim 1, wherein a thickness of said electromotive body is not less than half ($\lambda/2$) and not more than 4 times ($4\lambda$) a spin diffusion length $\lambda$.

12. Thermoelectric conversion element according to claim 1, wherein an electric current is generated in said electromotive body in a direction perpendicular to both of a direction of a temperature gradient and said direction of said magnetization of said magnetic body.

* * * * *